(12) United States Patent
McCann

(10) Patent No.: US 12,054,254 B2
(45) Date of Patent: Aug. 6, 2024

(54) METHOD AND SYSTEM FOR COOLING ELECTRONICS IN AN UNMANNED AERIAL VEHICLE

(71) Applicant: Daniel McCann, Regina (CA)

(72) Inventor: Daniel McCann, Regina (CA)

(*) Notice: Subject to any disclaimer, the term of this patent is extended or adjusted under 35 U.S.C. 154(b) by 156 days.

(21) Appl. No.: 17/730,414

(22) Filed: Apr. 27, 2022

(65) Prior Publication Data

US 2022/0363382 A1 Nov. 17, 2022

Related U.S. Application Data

(60) Provisional application No. 63/187,029, filed on May 11, 2021.

(51) Int. Cl.
| | | |
|---|---|---|
| *B64C 39/02* | (2023.01) | |
| *B64D 33/00* | (2006.01) | |
| *B64U 20/92* | (2023.01) | |
| *B64U 20/96* | (2023.01) | |
| *H05K 7/20* | (2006.01) | |

(52) U.S. Cl.
CPC ............ *B64C 39/024* (2013.01); *B64D 33/00* (2013.01); *B64U 20/92* (2023.01); *B64U 20/96* (2023.01); *H05K 7/20145* (2013.01); *H05K 7/20154* (2013.01); *H05K 7/20336* (2013.01); *H05K 7/2039* (2013.01)

(58) Field of Classification Search
CPC ........ B64U 20/90; B64U 20/92; B64U 20/96; B64C 39/024
See application file for complete search history.

(56) References Cited

U.S. PATENT DOCUMENTS

| | | | |
|---|---|---|---|
| 8,123,460 B2* | 2/2012 | Collette | B64D 13/006 361/699 |
| 2018/0072431 A1* | 3/2018 | Sahu | B64D 33/08 |
| 2018/0170553 A1* | 6/2018 | Wang | B64U 20/80 |
| 2019/0009878 A1* | 1/2019 | Wang | B64U 20/92 |
| 2019/0033932 A1* | 1/2019 | Ku | B64U 50/19 |

* cited by examiner

*Primary Examiner* — Richard G Davis

(57) ABSTRACT

The present disclosure provides an unmanned aerial vehicle (UAV) having a housing containing electronic components required of the UAV and a heat transfer device for cooling heat generated by said electronic components; at least one boom for connecting said housing to at least one propeller. The boom includes one or more inlet located on a first surface of the boom and within an airflow of said at least one propeller; at least one outlet on a second surface of the boom; a hallow channel extending in interior of the boom from said at least one inlet to said at least one outlet, wherein said airflow generated by said at least one propeller passes into said at least one inlet through the hollow channel to said at least one outlet providing cooling for said heat transfer device.

12 Claims, 5 Drawing Sheets

METHOD AND SYSTEM FOR COOLING ELECTRONICS IN AN UNMANNED AERIAL VEHICLE

The present application claims priority from the US provisional patent application bearing Ser. No. 63/187,029, filed May 11, 2021, the specifications of which are hereby incorporated by reference.
U.S. Provisional Patent Application Ser. No. 63/187,029

FIELD

This invention is in the field of cooling or heat transfer systems and methods for removing heat from electronic systems and more specifically cooling or heat transfer systems and methods for removing heat from electronic systems used for an unmanned aerial vehicle (UAV).

BACKGROUND

U.S. Publication No. 2010/0021288 to Collette discloses a fan of a UAV creating airflow comprising outside air directed across a duct of the UAV. This airflow generated by the fan of a UAV provides heat transfer from an equipment enclosure accomplishes efficient heat transfer. The methods for transferring heat from an equipment enclosure using an airflow generated by a fan of a UAV may be employed for UAVs having a variety of duct shapes, and having equipment enclosures inside the duct or in detachable equipment enclosures located on the duct of the UAV.

U.S. Pat. No. 7,325,772 to Hanewinkel et al. discloses an aircraft component including a first section adapted to be attached at an exterior surface of an aircraft to close an access opening through the exterior surface; and a second section extending outward from the first section and forming heat transfer surfaces to transfer heat from the first section to air passing by the exterior surface and second section during flight of the aircraft. The first and second sections are integrally formed as a one-piece member.

WIPO Publication No. WO/2016/041145 to Tang et al. discloses a heat dissipation apparatus and a UAV using the heat dissipation apparatus. The heat dissipation apparatus comprises a wind guide cover, a heat conducting plate, and an installation support. The wind guide cover comprises an air duct pipe used for guiding an air flow, and comprises an air inlet and an air outlet that are separately located at two ends of the air duct pipe. A side wall of the air duct pipe is provided with a penetrating mounting window. The heat conducting plate is disposed on the mounting window and covers the installation window, and a surface of the heat conducting plate facing away from the air duct pipe is used for fixing a second electronic module. The installation support is used for fixing a first electronic module into the air duct pipe, the installation support and the heat conducting plate are disposed at an interval, and the installation support is located in the air duct pipe. The heat dissipation apparatus can perform separated heat dissipation on multiple electronic modules, and therefore mutual influence of heat generated by the electronic modules is avoided, and heat generated by the electronic modules can be rapidly taken away by means of the air flow circulating in the air duct pipe of the wind guide cover.

Chinese Patent No. 110450953 to Liu discloses an unmanned aerial vehicle with a heat dissipation function for offshore security patrol, which comprises a main body, four rotor wings, four support rods and four cameras, wherein the main body is cylindrical, the four rotor wings are uniformly arranged on the main body in the circumferential direction by taking the axis of the main body as the center, the support rods are in one-to-one correspondence with the rotor wings, the support rods are parallel to the main body, the top ends of the support rods are fixedly connected with the main body, the cameras are in one-to-one correspondence with the support rods, the cameras are arranged on one side of the support rods far away from the main body, a driving device is arranged on the main body, a control system and a fault monitoring system are arranged in the main body, an auxiliary mechanism and a heat dissipation mechanism are arranged on the main body, the heat dissipation function is realized by the heat dissipation mechanism, and the unmanned aerial vehicle with the heat dissipation function for the offshore security, moreover, the function of emergency landing on the water surface is realized through the auxiliary mechanism.

SUMMARY

The invention may comprise any and/or all aspects as described herein with the understanding of a person skilled in the art.

DESCRIPTION OF THE DRAWINGS

While the invention is claimed in the concluding portions hereof, example embodiments are provided in the accompanying detailed description which may be best understood in conjunction with the accompanying diagrams where like parts in each of the several diagrams are labeled with like numbers, and where:

DETAILED DESCRIPTION

Unmanned aerial vehicles, such as described in U.S. App. Ser. No. 63/162,938, filed on Mar. 18, 2021, and International Patent App. Serial No. PCT/CA2020/050276, filed on Feb. 28, 2020, the contents of both which are herein explicitly incorporated by reference, may contain one or more electronic components 118 that generate heat as a byproduct. The electronic components 118 that may generate significant amounts of heat may be a central processing unit (CPU), a graphical processing units (GPU), and/or tangible computer-readable memory. If the heat from the CPU and/or the GPU is not removed, the CPU and/or the GPU may throttle a performance in order to reduce generated heat. In the most extreme case, the CPU and/or GPU may enter a thermal shutdown state.

Solutions to remove the heat from the electronic components 118 may involve the use of heatsink systems that may use an airspeed of the UAV 100 and/or airflow from dedicated fans attached to a radiator. While effective, the heatsinks and/or the dedicated fans may add weight and/or increase power usage from a battery supply. Each gram of weight may impact maneuverability and/or energy efficiency, and/or additional battery draw to power the dedicated fans may reduce battery capacity and/or flight time.

Other solutions to remove the heat from the electronic components 118 may involve using ducting to route airflow generated by the airspeed of the UAV 100 to heatsinks attached to the electronic components 118. While effective during directional flight, the ducting loses effectiveness during a hover maneuver of the UAV 100, where the airspeed and thus the airflow into the ducting is near zero. The hover maneuver may cause overheating of the electronic components 118 and therefore may require the UAV 100 to be in a constant motion.

Other solutions may mounts heatsinks into a ducted fan blade of the UAV 100. While potentially useful, these heatsinks may add weight and/or may have limited usefulness for any UAV 100 which uses the ducted approach. As most commercial UAVs 100 do not use the ducted fan blade, the ducted approach has limited usefulness.

When the UAV 100 is used in hot climates and/or dusty environments, such as in an agricultural application, dust particles may contact passive-cooling radiative systems. The dust particles may collect on the heatsinks and reduces a cooling efficiency.

As described herein, one or more aspects for cooling of the electronic components 118 of the UAV 100 may provide cooling for both transit maneuvers and/or hover maneuvers. The aspects may involve no additional heavy components by leveraging a structure of the UAV 100. The structure of the UAV 100 may capture propeller and/or motor airflow and deflect/direct the airflow toward a center of the UAV 100 to circulate high velocity air to the electronic components 118. The aspects may achieve cooling while adding limited amounts of weight and while operating in hover mode.

Figure 1:
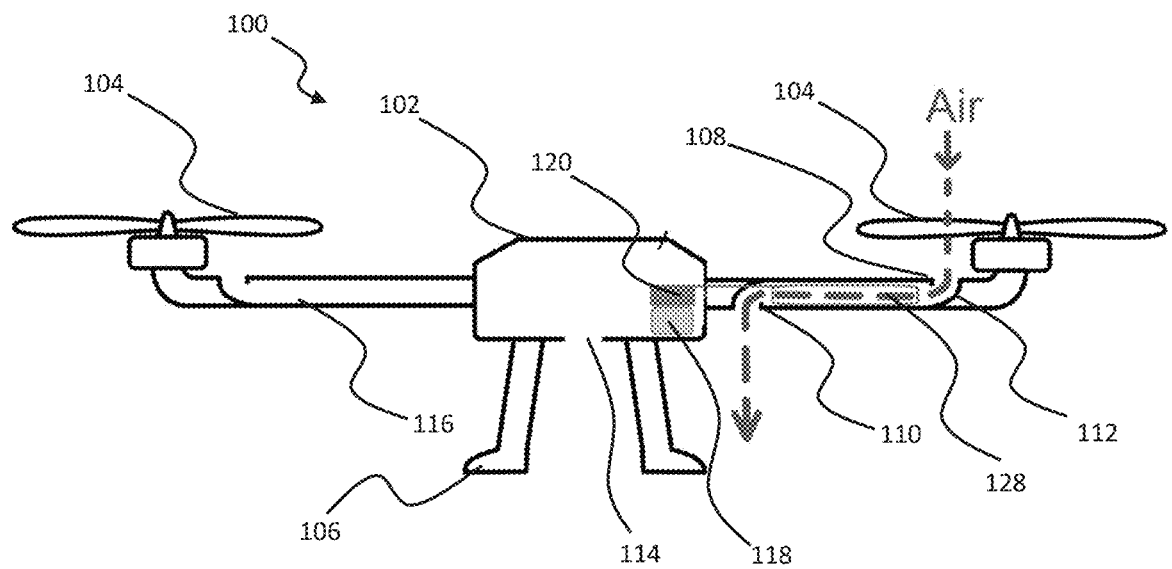
FIG. 1 is a side cross-section view of a heat transfer system for an unmanned aerial vehicle.
Figure 2:
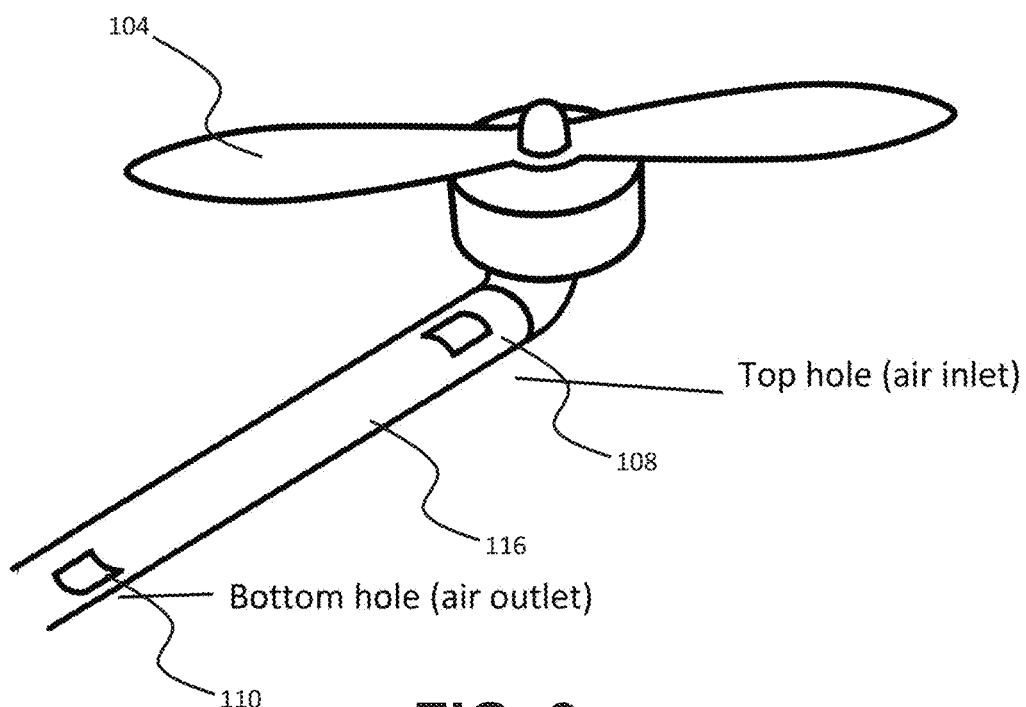
FIG. 2 is a top perspective view of a propeller for the UAV showing one or more ports.
Figure 3:
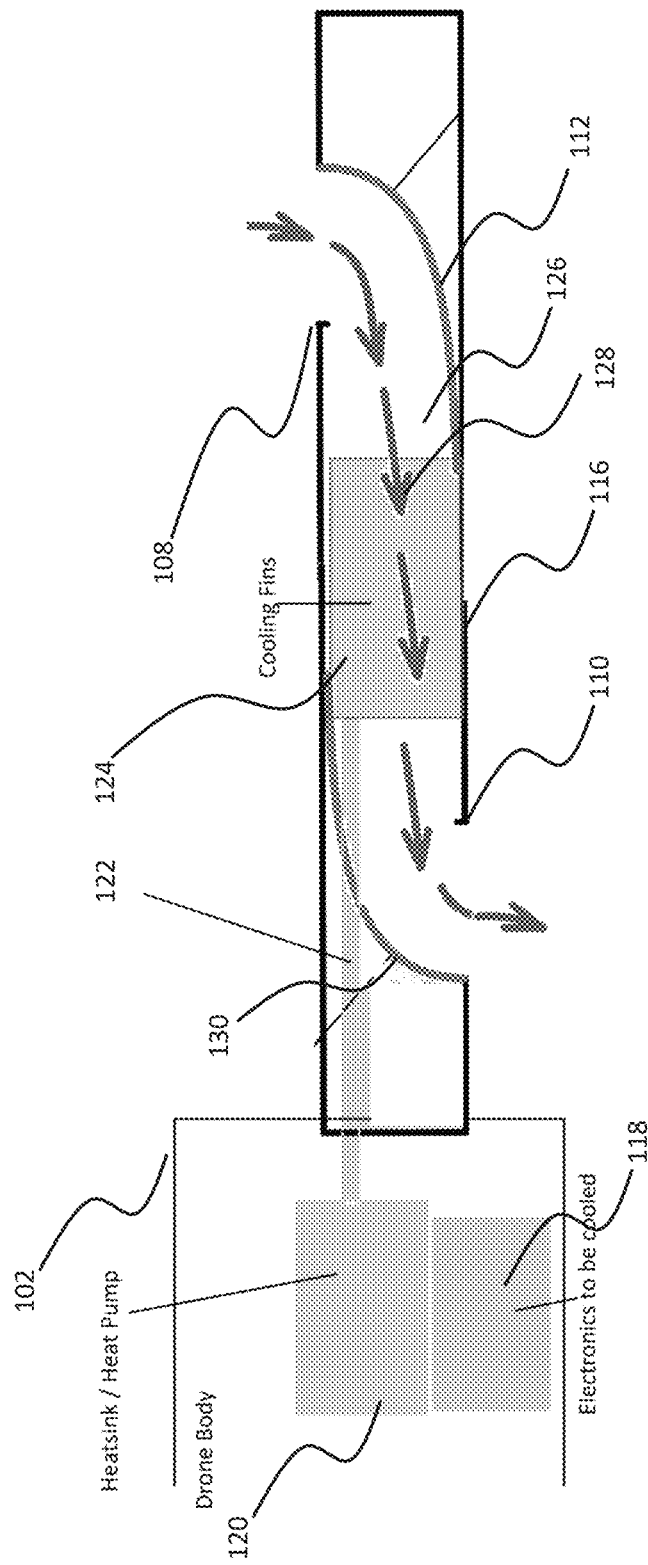
FIG. 3 is an enlarged cross-section view of the heat transfer system for the UAV.

Turning to FIGS. 1 to 3, one aspect of the heat transfer system for the UAV 100 is shown. The UAV 100 may have a housing or body 102 coupled to one or more propellers 104 by one or more booms 116. The housing 102 may have one or more skids or feet 106 that hold the housing 102 off of a ground surface when the UAV 100 is not airborne.

Shown in more detail in FIG. 3, the housing 102 may hold one or more electronic components 118 that may be generating heat. One or more heat transfer devices 120, such as a heat sink, may transfer the heat away from the electronic components 118. The boom 116 may have one or more inlets 108 located on a top surface of the boom 116. The inlets 108 may be located within an airflow of the one or more propellers 104 (and/or a motor driving the propeller 104). The boom 116 may also have one or more outlets 110 located on a bottom surface of the boom 116. An interior of the boom 116 may form a hollow channel (or channels) 126 from the inlet(s) 108 to the outlet(s) 110. When the propeller 104 spins, a portion of the airflow may pass into the inlets(s) 108 causing an airflow 128 within the hollow channel 126 towards the outlet(s) 110 and/or the housing 102. An inlet deflector 112 may be placed along the inlet(s) 108 to aid in directing the airflow 128 along the hollow channel 126. Similarly, an outlet deflector 130 may be placed along the outlet(s) 110 to aid in directing the airflow 128 out of the outlet(s) 110. In some aspects, the hollow channel 126 may have a narrow portion in order to increase a velocity of the airflow 128.

The one or more heat transfer devices 120 may be thermally coupled to a heat pipe 122 that may transfer the heat along the boom 116. The heat pipe 122 may be thermally coupled to one or more cooling fins 124. The cooling fins 124 may be within the hollow channel 126 and/or aligned with the airflow along the hollow channel 126 to facilitate dissipation of the heat into the airflow 128. Since the propeller 104 may be pushing the portion of the airflow into the channel 126, a constant supply of cool airflow 128 may be passed over the cooling fins 124 and a heated air may be passed out of the outlet 110. The airflow 128 may be sufficient to prevent and/or reduce any dust accumulation on the cooling fins 124. In some aspects, the cooling fins 124 may narrow the hollow channel 126 causing an increase in the velocity of the airflow 128 over the cooling fins 124. In an aspect, the heat pipe 122 may be a conductor conducting heat from the heat transfer device 120 to the cooling fins 124. In another aspect, the heat pipe 122 may pump a fluid from the heat transfer device 120 to the cooling fins 124. In yet another aspect, the heat pipe 122 may comprise the conductor and the fluid for transferring heat from the heat transfer device 120 to the cooling fins 124.

Figure 4:
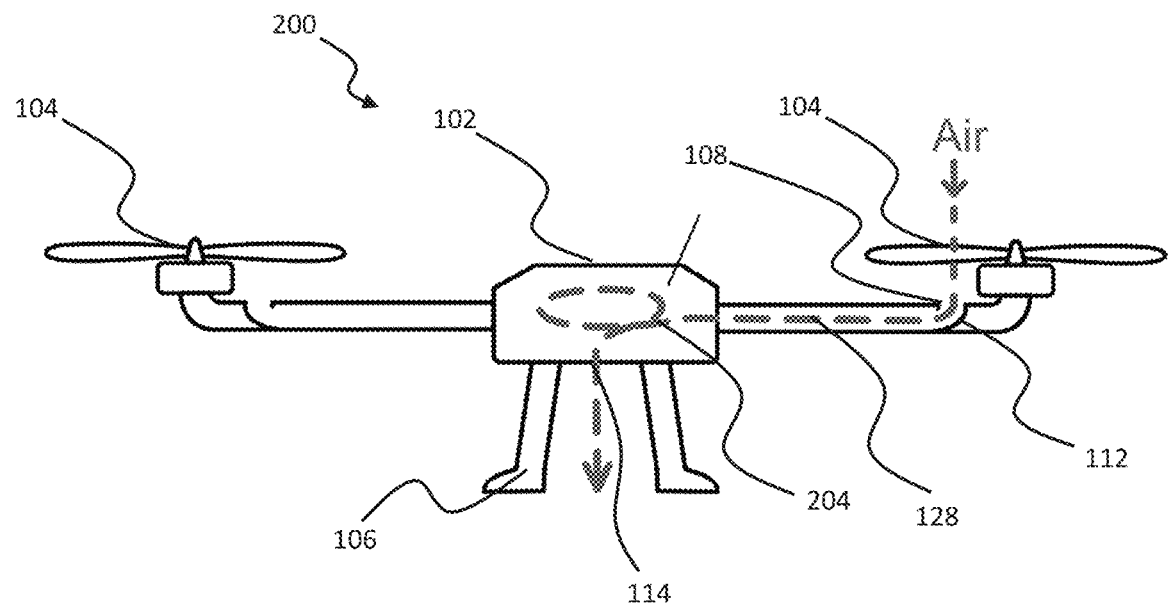
FIG. 4 is a side cross-section view of the heat transfer system for the UAV according to another aspect.
Figure 5:
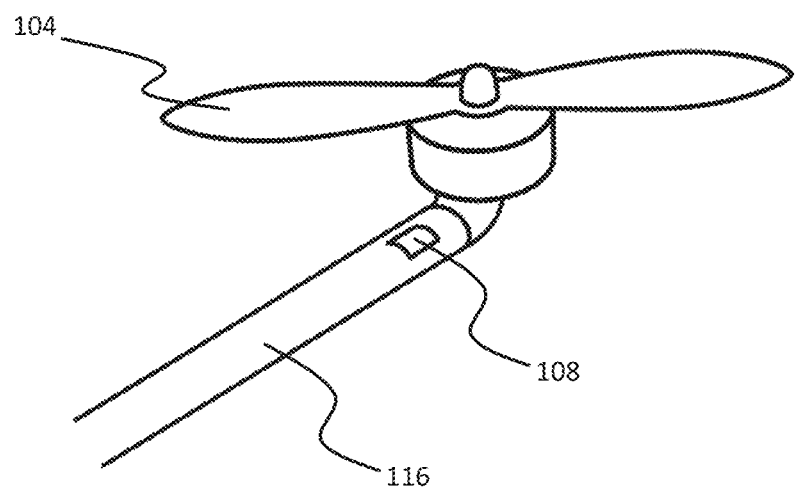
FIG. 5 is a top perspective view of the propeller for the UAV showing one or more ports.
Figure 6:
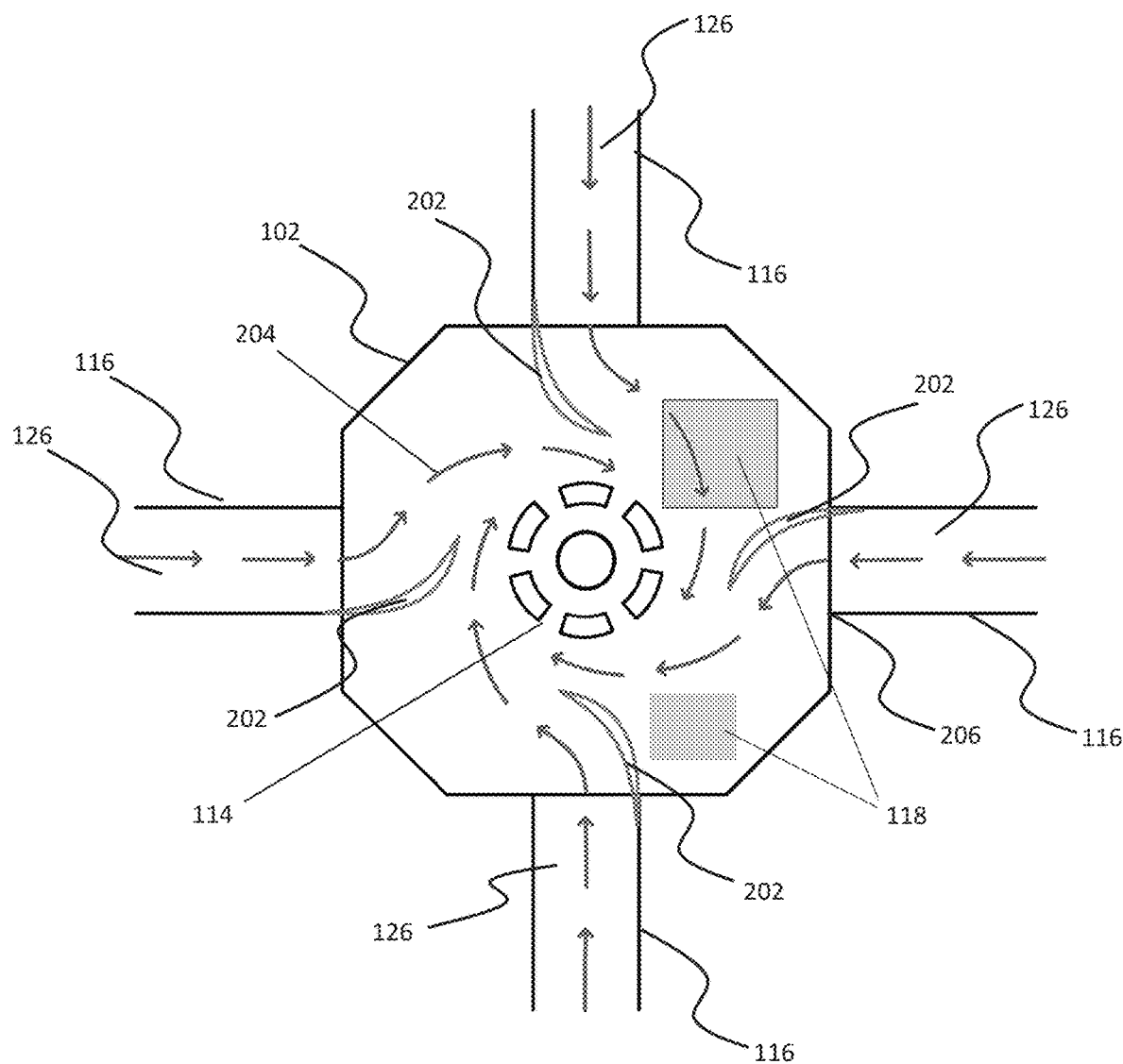
FIG. 6 is a top cross-section view of a body of the UAV showing airflow through the body.

In another aspect shown particularly in FIGS. 4 to 6, the housing 102 may hold one or more electronic components 118 that may be generating heat. The boom 116 may have one or more inlets 108 located on a top surface of the boom 116. The inlets 108 may be located within an airflow of the one or more propellers 104. The interior of the boom 116 may form a hollow channel (or channels) 126 from the inlet(s) 108 to an interior of the housing 102. When the propeller 104 spins, a portion of an airflow may pass into the inlets(s) 108 causing the airflow 128 within the hollow channel 126 towards the housing 102. An inlet deflector 112 may be placed along the inlet(s) 108 to aid in directing the airflow along the hollow channel 126.

Shown particularly in FIG. 6, the housing 102 may have one or more cyclonic deflectors 202 at one or more connections 206 of the hollow channel 126 with the housing 102. The cyclonic deflectors 202 in this aspect direct a cyclonic airflow 204 in a clockwise direction. In another aspect, the cyclonic deflectors 202 may direct the cyclonic airflow 204 in a counterclockwise direction. The cyclonic airflow 204 may pass over the electronic components 118. In some aspects, the electronic components 118 may have one or more heat transfer devices 120 transferring heat from the electronic components 118 into the cyclonic airflow 204. The cyclonic airflow 204 may be sufficient to prevent and/or reduce any dust accumulation within the housing 102. The airflow 204 may then exit the housing 102 using one or more outlets 114 in a bottom of the housing 102. In some aspect, an additional deflector (not shown) may channel the airflow 204 out of the outlets 114.

Figure 7:
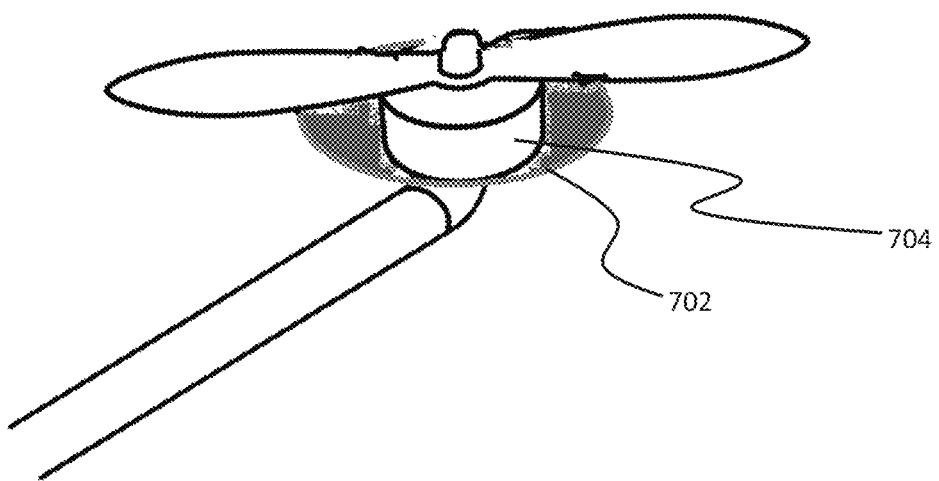
FIG. 7 illustrates a schematic view of the inlet of the heat transfer system having a funnel below the propeller for receiving airflow from the propeller in accordance with one embodiment of the present disclosure.

According to an aspect shown in FIG. 7, the inlet 108 may comprise a funnel 702 below the propeller 104 for receiving airflow from the propeller 104. The funnel 702 may improve the airflow into the inlet 108 with a slightly reduced efficiency of the propeller 104. In the aspect shown in FIG. 7, the funnel 702 encompasses a motor housing 704. In other aspects, the funnel 702 may be located at or near the inlet 108 shown in FIGS. 2 and 5.

In some aspects, the inlets 108 may have a dust filter (not shown) placed over the inlet 108 and/or placed within the channel 126.

Although the aspects herein demonstrate a dual rotor system as shown in FIGS. 1 to 3 and a four rotor system as shown in FIGS. 4 to 6, other aspects may have a single rotor or more than four rotors without departing from the scope of the description herein. In another aspect, the UAV 100 may have twin propellers 104 (e.g. an upper propeller and a lower propeller) on each boom 116.

The above detailed description of the embodiments of the invention is not intended to be exhaustive or to limit the invention to the precise form disclosed above or to the particular field of usage mentioned in this disclosure. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated.

While certain aspects of the invention are presented below in certain claim forms, the inventor contemplates the various aspects of the invention in any number of claim forms. Accordingly, the inventor reserves the right to add additional claims after filing the application to pursue such additional claim forms for other aspects of the invention.

The foregoing is considered as illustrative only of the principles of the invention. Further, since numerous changes and modifications will readily occur to those skilled in the art, it is not desired to limit the invention to the exact construction and operation shown and described, and accordingly, all such suitable changes or modifications in structure or operation which may be resorted to are intended to fall within the scope of the claimed invention.

What I claim:

1. A unmanned aerial vehicle (UAV) comprising:
a housing containing electronic components required of the UAV and a heat transfer device for cooling heat generated by said electronic components;
at least one boom for connecting said housing to at least one propeller, the at least one boom comprising:
at least one inlet located on a first surface of the boom and within an airflow of said at least one propeller;
at least one outlet on a second surface of the boom; and
a hollow channel extending in interior of the boom from said at least one inlet to said at least one outlet, wherein said airflow generated by said at least one propeller passes into said at least one inlet through the hollow channel to said at least one outlet providing cooling for said heat transfer device.

2. The UAV in claim 1, wherein said heat transfer device extends at least partially along said hollow channel to transfer heat from said heat transfer device along the boom.

3. The UAV in claim 1, further comprising a secondary heat transfer device thermally coupled to said first heat transfer device and extending at least partially along said hollow channel to transfer heat from said heat transfer device along the boom.

4. The UAV in claim 3, wherein said secondary heat transfer device comprises a heat pipe for transferring heat along the boom.

5. The UAV in claim 4, wherein said secondary heat transfer device further comprises at least one cooling fin extended along said hollow channel and thermally coupled to said heat pipe.

6. The UAV in claim 1, wherein said heat transfer device is a heat sink at least partially thermally coupled to said electronic components.

7. The UAV in claim 1, wherein said heat transfer device is a heat pump.

8. The UAV in claim 1, further comprising an inlet deflector placed along said at least one inlet to aid in directing the airflow along the hollow channel.

9. A method for cooling electronic components of an unmanned aerial vehicle (UAV), the method comprising:
creating airflow using at least one propeller of said UAV;
directing said airflow through a hollow channel of a boom of said UAV towards said electronic components of the UAV; and
using said air flow to increase cooling capacity of a heat transfer device used for cooling said electronic components;
wherein said using said airflow to increase cooling capacity of said heat transfer device comprises thermally coupling said heat transfer device to a secondary heat transfer device extending at least partially along said hollow channel to transfer heat from said heat transfer device along the boom.

10. The method in claim 9, wherein said secondary heat transfer device comprises a heat pipe for transferring heat along the boom.

11. The method in claim 10, wherein said secondary heat transfer device further comprises at least one cooling fin extended along said boom inside said hollow channel and thermally coupled to said heat pipe.

12. A method for cooling electronic components of an unmanned aerial vehicle (UAV), the method comprising:
creating airflow using at least one propeller of said UAV;
directing said airflow through a hollow channel of a boom of said UAV towards said electronic components of the UAV; and
using said air flow to increase cooling capacity of a heat transfer device used for cooling said electronic components;
wherein said directing said airflow through a hollow channel of a boom of said UAV towards said electronic components of the UAV comprising using an inlet deflector to aid in directing the airflow along the hollow channel.

* * * * *